(12) United States Patent
Wu et al.

(10) Patent No.: US 7,196,019 B2
(45) Date of Patent: Mar. 27, 2007

(54) METHOD OF REMOVING SPACERS AND FABRICATING MOS TRANSISTOR

(75) Inventors: Chih-Ning Wu, Hsinchu (TW); Charlie C J Lee, Hsinchu Hsien (TW); Kuan-Yang Liao, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 108 days.

(21) Appl. No.: 10/905,185

(22) Filed: Dec. 21, 2004

(65) Prior Publication Data
US 2006/0134899 A1    Jun. 22, 2006

(51) Int. Cl.
*H01L 21/302* (2006.01)
(52) U.S. Cl. .................................. 438/745
(58) Field of Classification Search ........... 438/305, 438/745
See application file for complete search history.

(56) References Cited

U.S. PATENT DOCUMENTS 4,908,326 A * 3/1990 Ma et al. .................... 438/305

* cited by examiner

*Primary Examiner*—Carl Whitehead, Jr.
*Assistant Examiner*—Monica D. Harrison
(74) *Attorney, Agent, or Firm*—Jianq Chyun IP Office

(57) ABSTRACT

A method of removing spacers after forming a MOS transistor on a wafer. The MOS transistor comprises a gate disposed on the substrate, spacers disposed on the sidewalls of the gate and a source and a drain region in the substrate beside the spacers. The spacers are removed by performing a wet etching process in the dark such that during the spacer removal process, the source and the drain region in a MOS transistor can be prevented from damages.

8 Claims, 6 Drawing Sheets

METHOD OF REMOVING SPACERS AND FABRICATING MOS TRANSISTOR

BACKGROUND OF THE INVENTION

1. Field of the Invention

The present invention relates to a method of fabricating a semiconductor device. More particularly, the present invention relates to a method of removing spacers and fabricating metal-oxide-semiconductor (MOS) transistors.

2. Description of the Related Art

Metal-oxide-semiconductor (MOS) transistor is an important device in a semiconductor. FIG. 1A is schematic cross-sectional view of a conventional MOS transistor. As shown in FIG. 1A, a MOS transistor 120 is usually disposed on a substrate 100 (for example, a polysilicon substrate). The MOS transistor comprises a gate structure 122, a source region 124s, a drain region 124d and spacers 126. The gate structure 122 is disposed over the substrate 100. The gate structure 122 comprises a gate dielectric layer 122a and a gate layer 122b sequentially stacked over the substrate 100. The source region 124s and the drain region 124d are disposed in the substrate 100 on the two sides of the gate structure 122, respectively. The spacers 126 are disposed on the sidewalls of the gate structure 122.

To improve the mobility of electrons and holes in the channel region (the region underneath the gate structure 122), the spacers 126 are often removed using phosphoric acid in a wet etching operation after the process for fabricating the MOS transistor 120 is completed. Thereafter, a strain layer 130 is formed over the MOS transistor 120 and the substrate 100 to adjust the lattice structure of the substrate 100 (as shown in FIG. 1B).

However, electrons and holes would traverse the PN junction between the source region 124s and the substrate 100 as well as the drain region 124d and the substrate 100. When phosphoric acid is used to remove the spacers 126, the phosphoric acid and the electrons and holes at the PN junction would trigger a photo-electrochemical reaction in the presence of light. Ultimately, the source region 124s and the drain region 124d are damaged. This damaging effect is more serious for an NMOS transistor. FIG. 2 is a photo of an NMOS transistor taken by a scanning electron microscope (SEM) showing the damages in the source and the drain region when the spacers are removed using phosphoric acid in the presence of light. As shown in FIG. 2, voids 128 (indicated by arrows) are formed in the source region 124s and the drain region 124d when the spacers 126 are removed using phosphoric acid in the present of light.

SUMMARY OF THE INVENTION

Accordingly, one objective of the present invention is to provide a method of removing spacers that can prevent the source and the drain region of a metal-oxide-semiconductor (MOS) transistor from damages.

Another objective of the present invention is to provide a method of fabricating a metal-oxide-semiconductor (MOS) transistor that can prevent the source and the drain region of the MOS transistor from damages with the method mentioned above.

To achieve these and other advantages and in accordance with the purpose of the invention, as embodied and broadly described herein, the invention provides a method of removing spacers from the sidewalls of a metal-oxide-semiconductor (MOS) transistor. The MOS transistor comprises a gate structure over a substrate, spacers on the sidewalls of the gate structure and a source region and a drain region in the substrate beside the spacers. The method of removing the spacers includes performing a wet etching process in the dark.

In one embodiment of the present invention, the material of the spacers is silicon nitride, for example.

In one embodiment of the present invention, the wet etching process is carried out using phosphoric acid, for example.

The present invention also provides a method of fabricating a MOS transistor. First, a gate structure is formed over a substrate. The gate structure comprises a gate dielectric layer and a gate layer sequentially stacked over the substrate. Thereafter, spacers are formed on the sidewalls of the gate structure. After that, a source region and a drain region are formed in the substrate beside the spacers. A wet etching process is carried out in the dark to remove the spacers on the sidewalls of the gate structure. Finally, a strain layer is formed over the substrate to cover the gate structure and the substrate. The strain layer mainly serves to adjust the lattice structure at the interface with the substrate.

In one embodiment of the present invention, the material of the spacers is silicon nitride, for example.

In one embodiment of the present invention, the wet etching process is carried out using phosphoric acid, for example.

In one embodiment of the present invention, the material of the strain layer is silicon oxide or silicon nitride, for example.

In one embodiment of the present invention, after forming the gate structure but before forming the spacers, the method further includes forming a lightly doped drain (LDD) region in the substrate on each side of the gate structure.

In the present invention, the process of removing the spacers from the sidewalls of the gate structure is carried out in total darkness. Hence, photochemical reaction at the source region and the drain region is prevented. In other words, damage to the source and the drain region can be significantly minimized.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
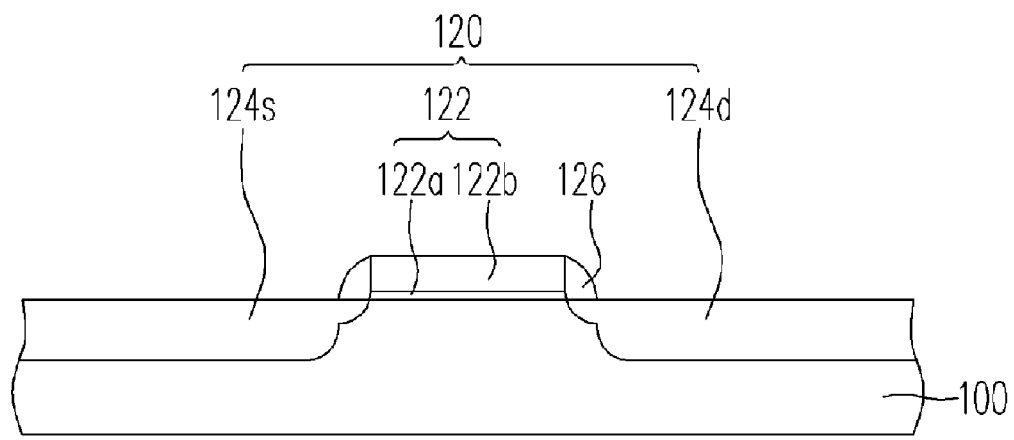
FIG. 1A is a schematic cross-sectional view of a conventional MOS transistor.
Figure 1B:
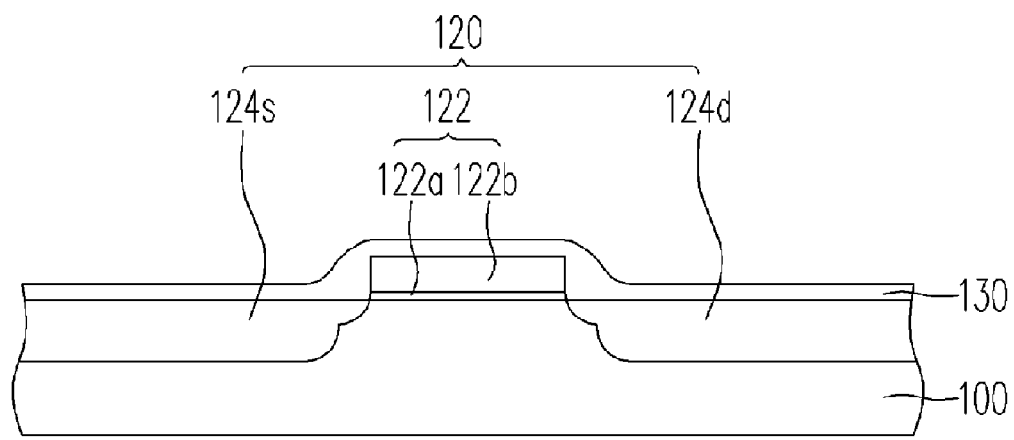
FIG. 1B is a schematic cross-sectional view of a conventional MOS transistor having a strain layer thereon.

Reference will now be made in detail to the present embodiments of the invention, examples of which are illustrated in the accompanying drawings. Wherever possible, the same reference numbers are used in the drawings and the description to refer to the same or like parts.

Figure 3A:
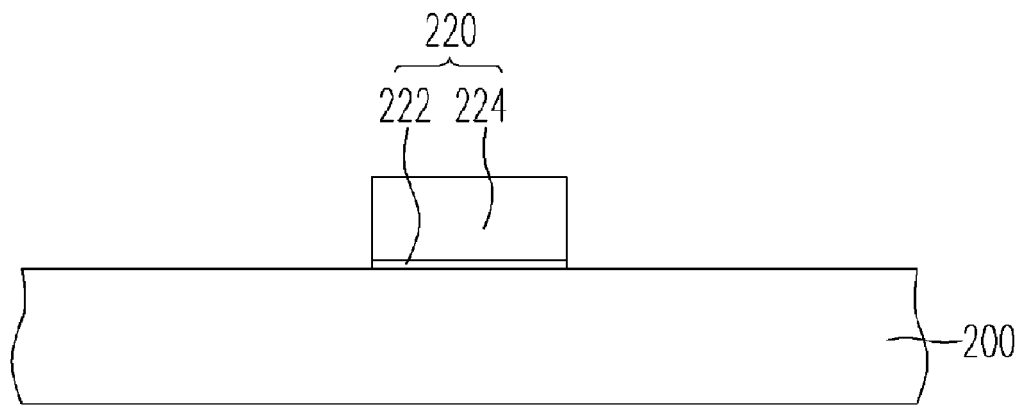
FIGS. 3A through 3F are schematic cross-sectional views showing the steps for fabricating a MOS transistor according to one embodiment of the present invention.

FIGS. 3A through 3F are schematic cross-sectional views showing the steps for fabricating a MOS transistor according to one embodiment of the present invention. As shown in FIG. 3A, a gate structure 220 is formed over a substrate 200. The gate structure 220 comprises a gate dielectric layer 222 and a gate layer 224 sequentially stacked over the substrate 200. The gate structure 220 is formed, for example, by depositing a gate dielectric material and a gate material sequentially over the substrate to form a gate dielectric layer and a gate layer and then performing a photolithographic and etching process. The gate dielectric layer 222 is a silicon oxide layer and the gate layer is a polysilicon or a silicide layer, for example.

Figure 3B:
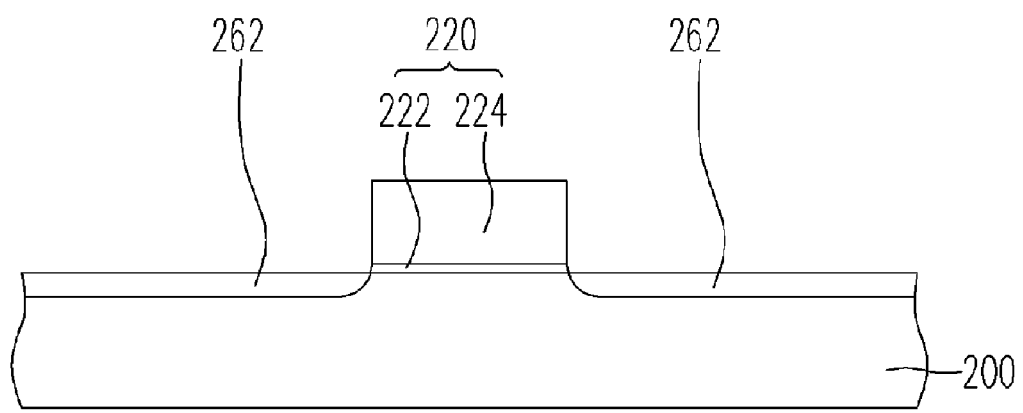

As shown in FIG. 3B, lightly doped regions 262 are formed in the substrate 200 beside the gate structure 220. The lightly doped regions 262 are formed, for example, by implanting dopants different from those in the substrate 200 into the substrate 200 beside the gate structure 220 in a thermal diffusion process or an ion implant process. In one embodiment, the substrate is a p-type substrate and the dopants are n-type dopants (for example, phosphorus or arsenic).

Figure 3C:
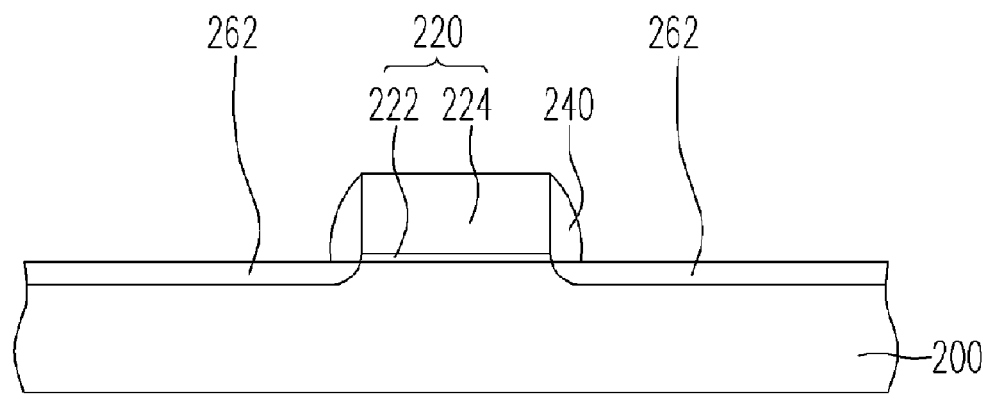

As shown in FIG. 3C, spacers 240 are formed on the sidewalls of the gate structure 220. The method of forming the spacers 240 includes, for example, depositing spacer material over the gate structure 220 and then performing an anisotropic etching process. The anisotropic etching process comprises a plasma etching operation. In addition, the material of the spacers 240 is silicon nitride, for example.

Figure 3D:
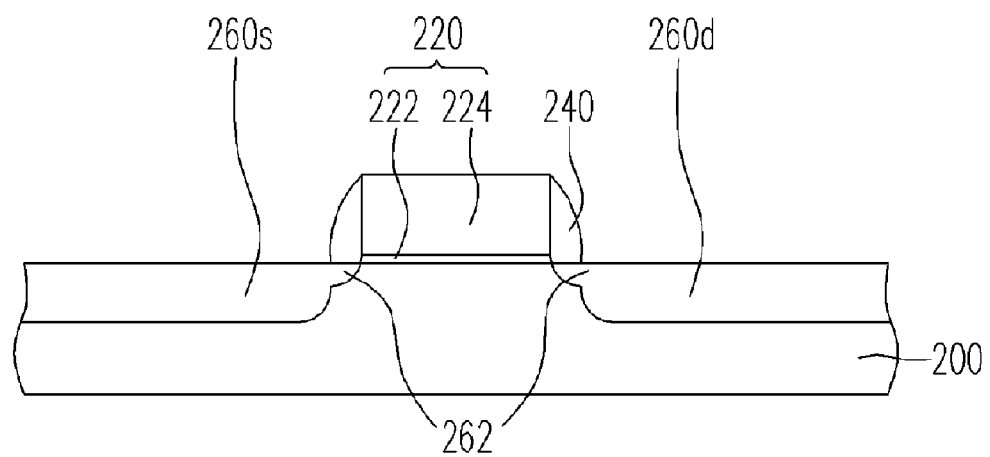

As shown in FIG. 3D, a source region 260s and a drain region 260d are formed in the substrate 200 beside the spacers 240. The lightly doped regions 262 underneath the spacers 240 now become lightly doped drain (LDD) regions capable of preventing short channel effect. The source region 260s and the drain region 260d are formed, for example, by diffusing dopants different from those in the substrate 200 into the substrate 200 beside the spacers 240 in a thermal diffusion process or an ion implant process. In one embodiment, the substrate is a p-type silicon substrate and the dopants are n-type dopants (for example, phosphorus or arsenic).

To improve the mobility of electrons and holes inside the channel region (the region underneath the gate structure 220), the l lattice structure in the substrate 200 is slightly modified in the following.

Figure 3E:
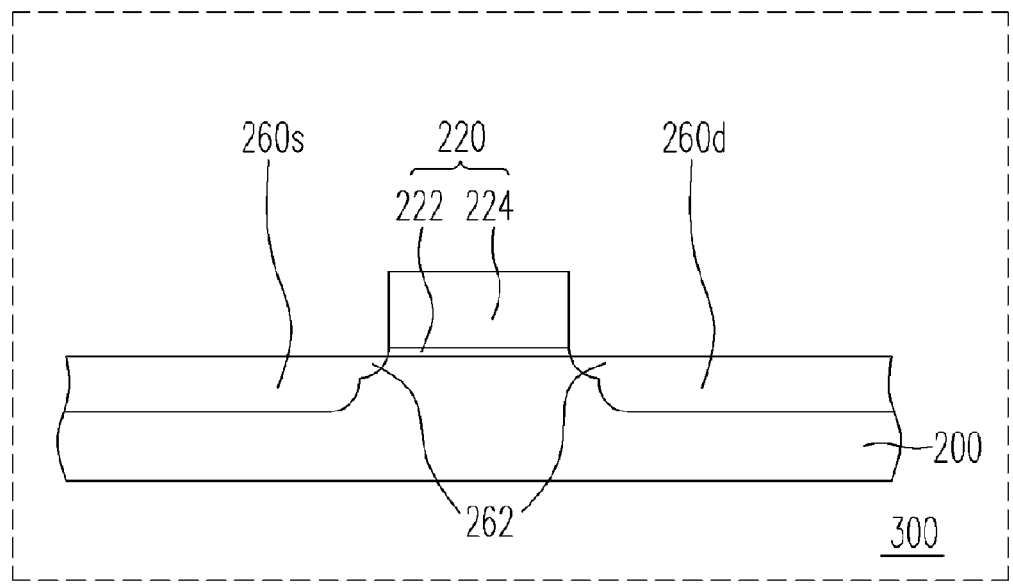

As shown in FIG. 3E, a wet etching operation is carried out in an environment 300 without any light to remove the spacers 240 on the sidewalls of the gate structure 220. In one embodiment of the present invention, phosphoric acid is used as the etchant in the wet etching operation. Furthermore, the dark environment 300 in which the wet etching operation is carried out includes a dark room where no light is allowed to enter or other space or installation where light is completely blocked.

Figure 2:
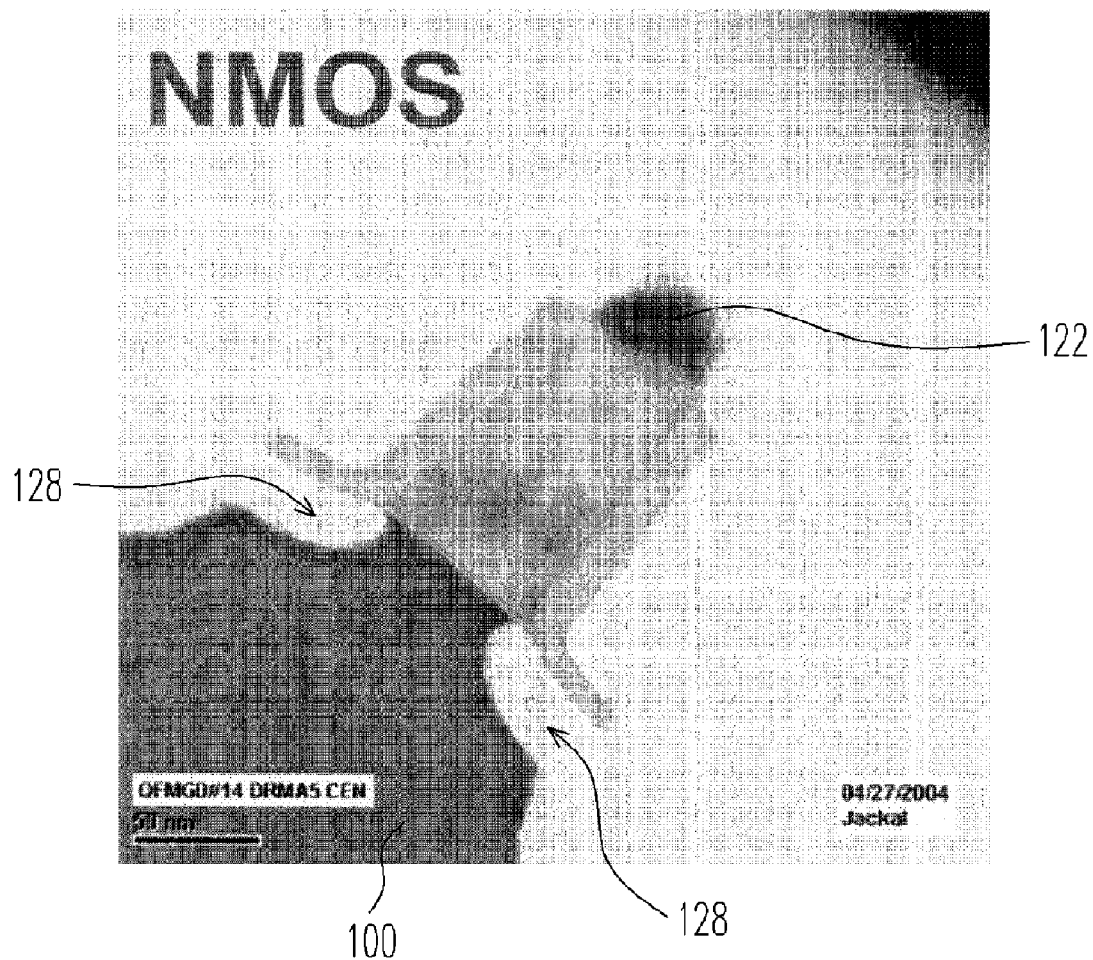
FIG. 2 is a photo of an NMOS transistor taken by a scanning electron microscope (SEM) showing the damages in the source and the drain region when the spacers are removed using phosphoric acid in the presence of light.
Figure 4:
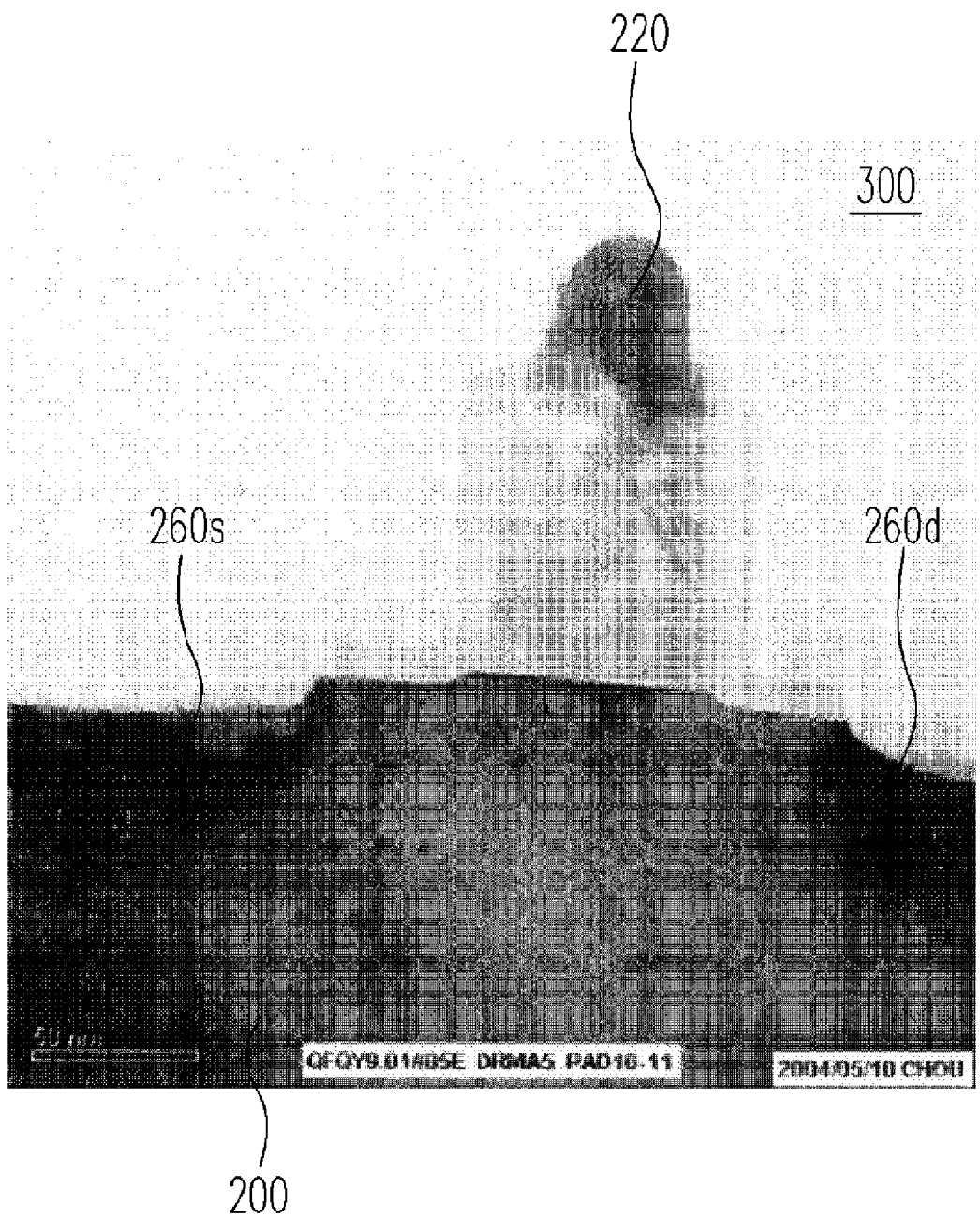
FIG. 4 is a photo of an NMOS transistor taken by a scanning electron microscope (SEM) showing the source and the drain region when the spacers are removed using phosphoric acid in darkness.

FIG. 4 is a photo of an NMOS transistor taken by a scanning electron microscope (SEM) showing the source and the drain region when the spacers are removed using phosphoric acid in darkness. When phosphoric acid is used to remove the spacers 240, the electrons and holes traversing the PN junction between the source region 260s and the substrate 200 or the drain region 260d and the substrate 200 would not trigger a photochemical reaction due to the absence of light. Hence, the source region 260s and the drain region 260d remain intact after the spacers are removed as shown in FIG. 4. Compared with the damage to the source and the drain region shown in FIG. 2, the present invention of removing the spacers 240 in total darkness can really reduce the damage to the source region 260s and the drain region 260d.

Figure 3F:
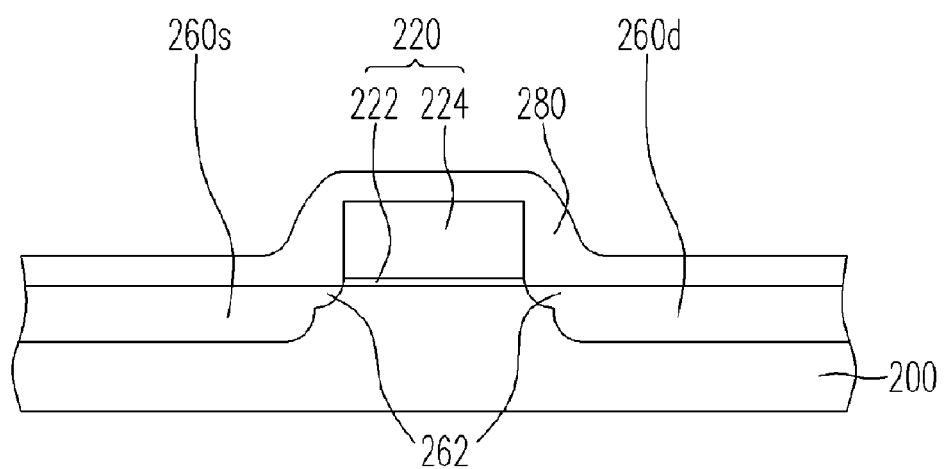

As shown in FIG. 3F, a strain layer 280 is formed over the substrate 200 to cover the gate structure 220 and the substrate 200. In the process of forming the strain layer 280, the lattice structure arrangement of the substrate 200 is modified. In one embodiment of the present invention, the strain layer 280 is a silicon oxide layer, a silicon nitride layer or other suitable materials, for example. Since a strain layer made of silicon oxide or silicon nitride has a larger lattice separation than that of the p-type silicon substrate 200, the p-type silicon lattice arrangement in the substrate 200 will be adjusted according to the lattice structure of the strain layer 280. As the lattice separation of the p-type silicon substrate 200 increases to match that of the strain layer 280, the mobility of the electrons and holes in the substrate 200 also increases. Hence, the current will be enhanced to improve the performance of the MOS transistor.

Obviously, the aforementioned method of removing the spacers is just one of the applications and hence should not be used to limit the scope of the present invention. Although the aforementioned process of fabricating the MOS transistor includes the step of forming a lightly doped drain region, it can be applied to fabricate a MOS transistor without any lightly doped region as well.

In summary, the present invention has at least the following advantages: 1. The source region and the drain region are protected from possible damage when the spacers are removed by carrying out a wet etching operation in the dark. Hence, overall yield of the MOS transistor is increased.

2. Using a strain layer to adjust the lattice separation of a substrate, the mobility of electrons within the substrate is increased. Hence, operating characteristics of the MOS transistor are improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of removing spacers after forming a metal-oxide-semiconductor (MOS) transistor, wherein the MOS transistor comprises a gate structure over a substrate, spacers on the sidewalls of the gate structure and a source region and a drain region in the substrate beside the gate structure; the method comprising the step of performing a wet etching process in a dark environment.

2. The method of claim 1, wherein the material constituting the spacers comprises silicon nitride.

3. The method of claim 2, wherein the etching agent for performing the wet etching process comprises phosphoric acid.

4. A method of fabricating a metal-oxide-semiconductor (MOS) transistor, the method comprising:

provid ing a substrate;

forming a gate structure over the substrate, wherein the gate structure comprises a gate dielectric layer and a gate layer sequentially stacked over the substrate;

forming spacers on the sidewalls of the gate structure;

forming a source region and a drain region in the substrate beside the gate structure;

performing a wet etching process in a dark environment to remove the spacers on the sidewalls of the gate structure; and forming a strain layer over the substrate to cover the gate structure and the substrate, wherein the strain layer is used for adjusting the lattice structure of the substrate.

5. The method of claim 4, wherein the material constituting the spacers comprises silicon nitride.

6. The method of claim 5, wherein the etching agent for performing the wet etching process comprises phosphoric acid.

7. The method of claim 4, wherein the material constituting the strain layer comprises silicon oxide or silicon nitride.

8. The method of claim 4, wherein after forming the gate structure but before forming the spacers, the method further comprises forming a lightly doped drain (LDD) region in the substrate beside the gate structure.

* * * * *